United States Patent
Shindo

(10) Patent No.: US 8,216,382 B2
(45) Date of Patent: Jul. 10, 2012

(54) FOREIGN MATTER REMOVAL METHOD AND STORAGE MEDIUM

(75) Inventor: Takehiro Shindo, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 12/636,946

(22) Filed: Dec. 14, 2009

(65) Prior Publication Data

US 2010/0147328 A1    Jun. 17, 2010

(30) Foreign Application Priority Data

Dec. 15, 2008  (JP) ................................ 2008-318236

(51) Int. Cl.
*B08B 5/00*  (2006.01)

(52) U.S. Cl. ............... 134/1.1; 134/1; 134/1.2; 134/18; 134/19; 134/21; 134/24; 134/26; 134/30; 134/42; 134/902; 355/53; 355/55; 355/77; 430/22; 430/30; 438/7; 438/16; 216/92

(58) Field of Classification Search ............... 134/1, 1.1, 134/1.2, 18, 19, 21, 24, 26, 30, 42, 902; 356/399, 356/400, 401, 614; 355/53, 55, 77; 430/22, 430/30; 438/7, 16; 216/92
See application file for complete search history.

(56) References Cited

U.S. PATENT DOCUMENTS

| | | | |
|---|---|---|---|
| 5,114,834 A * | 5/1992 | Nachshon | 430/329 |
| 6,175,418 B1 * | 1/2001 | Madeyski et al. | 356/399 |
| 6,205,870 B1 * | 3/2001 | Hosokawa et al. | 73/865.9 |
| 6,908,567 B2 * | 6/2005 | Uziel | 216/66 |
| 7,747,343 B2 * | 6/2010 | Hashimoto | 700/218 |
| 2001/0050272 A1 * | 12/2001 | Livshits et al. | 219/121.84 |
| 2002/0113218 A1 * | 8/2002 | Okumura et al. | 250/548 |
| 2009/0084403 A1 * | 4/2009 | Shindo | 134/6 |

FOREIGN PATENT DOCUMENTS

JP    5-206250    8/1993

* cited by examiner

*Primary Examiner* — Bibi Carrillo
(74) *Attorney, Agent, or Firm* — Oblon, Spivak, McClelland, Maier & Neustadt, L.L.P.

(57) ABSTRACT

A foreign matter removal method that removes foreign matter attached to a surface of a substrate having been subjected to predetermined processing. An edge of a rotating substrate mounted on a mounting stage is irradiated with misalignment measurement laser light. The misalignment measurement laser light other than the laser light blocked by the edge of the substrate is received, and power thereof is detected. The amount of misalignment of the substrate is calculated based on the detected power of the misalignment measurement laser light and a detected rotation angle of the rotating substrate. The misalignment of the substrate is corrected for based on the calculated amount of misalignment. After that, foreign matter removal laser light is irradiated, and a process gas that is to react with the foreign matter is jetted to the edge of the substrate. Consequently, the foreign matter attached to the substrate is decomposed and removed.

9 Claims, 7 Drawing Sheets

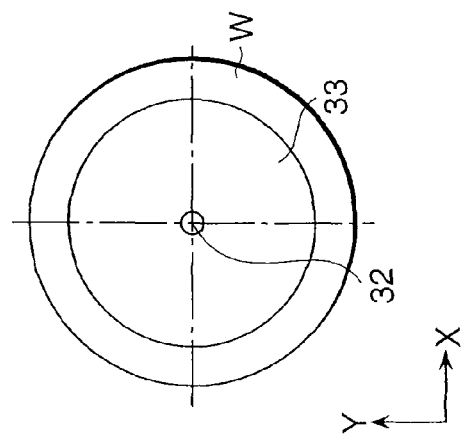
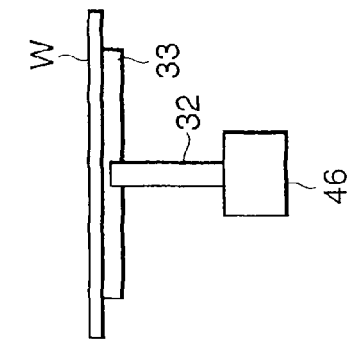
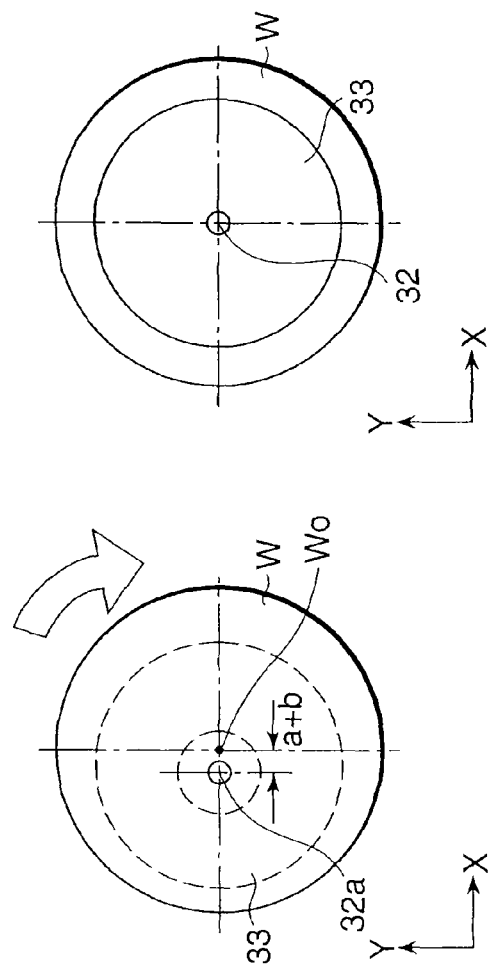
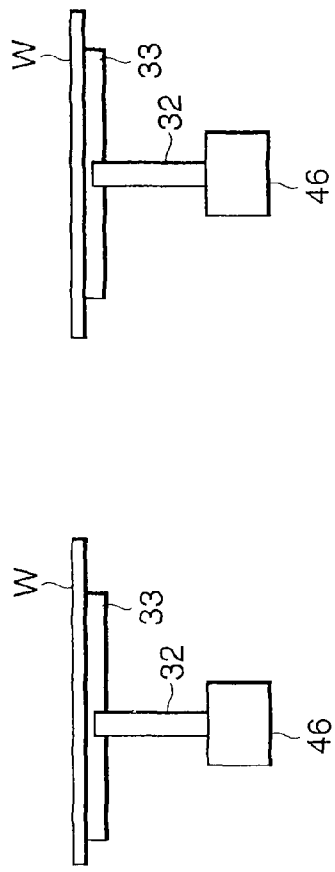
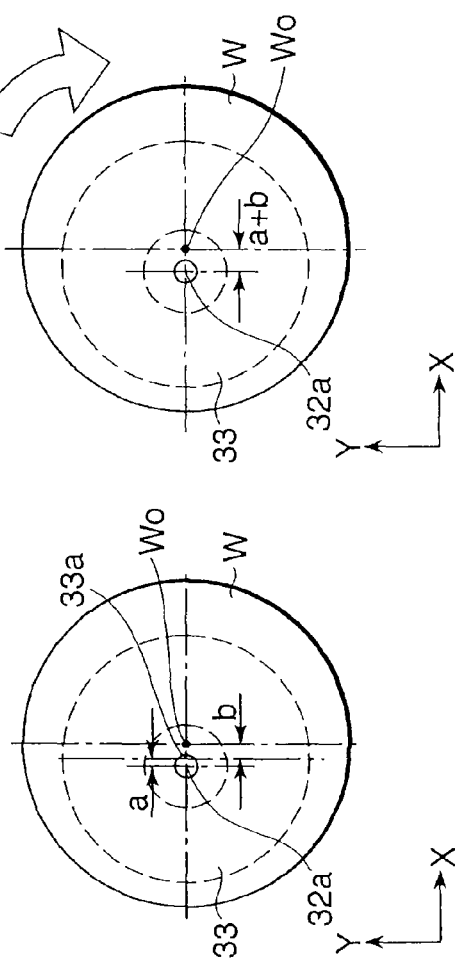
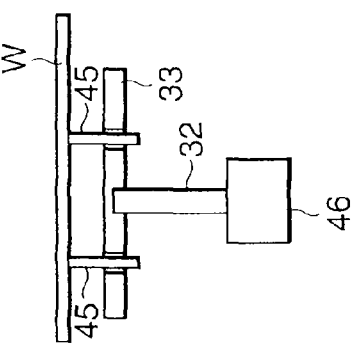

FOREIGN MATTER REMOVAL METHOD AND STORAGE MEDIUM

BACKGROUND OF THE INVENTION

1. Field of the Invention

The present invention relates to a foreign matter removal method and a storage medium, and in particular to a foreign matter removal method that removes foreign matter attached to a surface of a semiconductor substrate after plasma etching processing.

2. Description of the Related Art

If a plasma processing, for example, a plasma etching processing is carried out on a wafer as a substrate using plasma produced from a CF-type process gas, CF-type deposit arising from the CF-type process gas may become attached to a surface of the wafer. The CF-type deposit attached to the surface of the wafer is removed by sputtering using plasma (positive ions), but the CF-type deposit attached to a peripheral edge (hereinafter referred to as the "bevel portion") of the wafer cannot be removed because the bevel portion resists sputtering by plasma.

To cope with this, the CF-type deposit (for example, BSP) attached to the bevel portion is removed using a postprocessing apparatus. Specifically, the postprocessing apparatus heats the bevel portion of the wafer by irradiation with laser light, and supplies ozone gas toward the bevel portion so that the CF-type deposit can be decomposed into $CO$, $CO_2$, and $F_2$ through a chemical reaction and removed.

In the postprocessing apparatus that removes foreign matter attached to the surface of the wafer using laser light, before the wafer is transferred from a processing chamber (reaction chamber) into a postprocessing chamber and mounted on a mounting stage (stage) in the postprocessing chamber, it is necessary to detect and correct for a misalignment of the wafer.

As a method of correcting for a misalignment of the wafer or aligning the wafer in such a substrate processing apparatus, a method has conventionally been adopted in which the wafer is centered on the stage of the substrate processing apparatus while the amount of misalignment is monitored using a CCD camera and the misalignment is corrected for, or a method in which a jig (hereinafter referred to as the "stage plate") is mounted on the stage, and the wafer is mounted on the stage plate.

However, the method using the CCD camera has the disadvantage that the apparatus is expensive, there is a need to provide space for the CCD camera, and the CCD camera must be calibrated on a regular basis. Also, the method using the stage plate has the problem that the amount of misalignment becomes large because the amounts of misalignment are integrated due to a large number of times of alignment.

FIGS. 7A and 7B are views useful in explaining the problem of the substrate alignment method using the stage plate, in which FIG. 7A is a plan view of a wafer W mounted on the mounting stage in the substrate processing apparatus, and FIG. 7B is a side view of FIG. 7A.

Referring to FIGS. 7A and 7B, a stage 71 as the mounting stage is connected to a motor 73 via a shaft 72, and at the stage of alignment of the shaft 72 with respect to the stage 71, a misalignment 7A arises between the center of the shaft 72 and the center of the stage 71. Also, when a stage plate 74 is mounted on the stage 71, a misalignment 7B arises between the center of the stage 71 and the center of the stage plate 74. Further, when the wafer W is positioned on the stage plate 74, a misalignment 7C arises between the center of the stage plate 74 and the center of the wafer W. Thus, the final misalignment of 7A+7B+7C arises between the center of the shaft 72 and the center of the wafer W. Also, when various kinds of processing are carried out on the wafer W, the width of misalignment may gradually increase.

If the wafer W with the center position thereof misaligned is transferred to the postprocessing apparatus and mounted on the stage as the mounting stage by a transfer robot, postprocessing will automatically be performed on the wafer W remaining misaligned. Thus, a technique for detecting and correcting for the misalignment of the wafer W mounted on the stage in the postprocessing apparatus so as to properly carry out postprocessing has been demanded.

On the other hand, examples of publications disclosing prior arts in which a wafer W as a substrate to be processed is aligned by detecting the position of a notch in the wafer W include Japanese Laid-Open Patent Publication (Kokai) No. H05-206250. Japanese Laid-Open Patent Publication (Kokai) No. H05-206250 discloses the technique that laser light is irradiated on an outer end face of the wafer W on the stage from a horizontal direction, a reflected wave is received by a laser light-receiving unit to form an image, the position of a notch is recognized based on an image forming position varying according to whether the outer end face is far or near, and a misalignment of the wafer W is detected and corrected for based on the position of the notch and an output from a rotation angle detection unit.

However, the above prior art has the problem that a laser light irradiation unit and a light-receiving unit for exclusive use in aligning a substrate are needed, and hence the apparatus has to be large in size, resulting in elevated costs of the apparatus.

SUMMARY OF THE INVENTION

The present invention provides a foreign matter removal method using a foreign matter removal apparatus that removes foreign matter attached to a surface of a substrate having been subjected to predetermined processing, and a foreign matter removal method and a storage medium that enable a substrate to be aligned using a laser light irradiation unit and a light-receiving unit, which are provided so as to remove foreign matter, so that postprocessing can be properly carried out on the substrate.

Accordingly, in a first aspect of the present invention, there is provided a foreign matter removal method in which foreign matter attached to a substrate is removed using a foreign matter removal apparatus including a mounting stage that rotates with a substrate mounted thereon, a laser light irradiation unit that irradiates foreign matter removal laser light onto an edge of the substrate rotating on the mounting stage to remove foreign matter attached to the substrate, and a laser light-receiving unit that detects power of the laser light irradiated from the laser light irradiation unit, comprising an irradiation step in which the laser light irradiation unit irradiates misalignment measurement laser light onto the edge of the rotating substrate mounted on the mounting stage, a power detection step in which, of the irradiated misalignment measurement laser light, remaining laser light other than the laser light blocked by the edge of the substrate is received by the laser light-receiving unit, and power of the laser light is detected, a rotation angle detecting step of detecting a rotation angle of the rotating substrate, a calculation step of calculating an amount of misalignment of the substrate based on data on the power of the misalignment measurement laser light detected in the output detecting step and data on the rotation angle detected by the rotation angle detecting step, a correction step of correcting for the misalignment of the substrate based on the calculated amount of misalignment, and a decomposition step in which, after the misalignment has been corrected for, the laser light irradiation unit irradiates foreign matter removal laser light onto the edge of the substrate, and a process gas that is to react with the foreign matter is jetted to the edge of the substrate so that the foreign matter attached to the substrate is decomposed and removed.

According to the first aspect of the present invention, because the foreign matter removal method is comprised of the irradiation step in which the laser light irradiation unit for removing foreign matter attached to the substrate by cleaning irradiates the misalignment measurement laser light onto the edge of a rotating substrate mounted on the mounting stage, the power detection step in which, of the irradiated misalignment measurement laser light, remaining laser light other than the laser light blocked by the edge of the substrate is received by the laser light-receiving unit, and the power of the laser light is detected, the rotation angle detecting step of detecting the rotation angle of the rotating substrate, the calculation step of calculating the amount of misalignment of the substrate based on data on the power of the misalignment measurement laser light detected in the output detecting step and data on the rotation angle detected in the rotation angle detecting step, the correction step of correcting for the misalignment of the substrate based on the calculated amount of misalignment, and the decomposition step in which, after the misalignment has been corrected for, the laser light irradiation unit irradiates the foreign matter removal laser light onto the edge of the substrate, and the process gas that is to react with the foreign matter is jetted to the edge of the substrate so that the foreign matter attached to the substrate is decomposed and removed, the misalignment of the substrate to be processed can be corrected for using the existing equipment to carry out the appropriate postprocessing without the need to install additional equipment, and as a result, the time required for postprocessing can be shortened as compared with the prior art. Moreover, because the substrate to be processed is directly measured at the time of alignment, there is little possibility of misalignment of the substrate.

The first aspect of the present invention can provide a foreign matter removal method, wherein in the calculation step, the amount of misalignment of the substrate is calculated based on a relationship obtained in advance between the amount of misalignment between a center of the substrate and a rotation center of the mounting stage and power data on the misalignment measurement laser light.

According to the first aspect of the present invention, because in the calculation step, the amount of misalignment of the substrate is calculated based on the relationship obtained in advance between the amount of misalignment between the center of the substrate and the rotation center of the mounting stage and power data on the misalignment measurement laser light, the exact amount of misalignment can be obtained.

The first aspect of the present invention can provide a foreign matter removal method, wherein a transfer robot that mounts the substrate on the mounting stage is feedback-controlled based on the amount of misalignment of the substrate calculated in the calculation step.

According to the first aspect of the present invention, because the transfer robot adapted to mount the substrate on the mounting stage is feedback-controlled based on the amount of misalignment of the substrate calculated in the calculation step, the substrate can be accurately positioned on the mounting stage.

The first aspect of the present invention can provide a foreign matter removal method, wherein in the correction step, the substrate mounted on the mounting stage is once lift up by pin members projecting out from a substrate mounting surface of the mounting stage, the substrate is moved in such X and Y directions as to compensate for the misalignment while the substrate is being held by the pin members, and then the pin members are buried in the mounting stage so that the substrate is mounted on the mounting stage.

According to the first aspect of the present invention, because in the correction step, the substrate mounted on the mounting stage is once lift up by the pin members projecting out from the substrate mounting surface of the mounting stage, the substrate is moved in such X and Y directions as to compensate for the misalignment while the substrate is being held by the pin members, and then the pin members are buried in the mounting stage so that the substrate is mounted on the mounting stage, the misalignment of the substrate can be accurately corrected for, and as a result, postprocessing can be properly carried out.

The first aspect of the present invention can provide a foreign matter removal method, wherein the amount of misalignment of the substrate and an outside diameter of the substrate are obtained, and the misalignment of the substrate is corrected for based on the power data on the misalignment measurement laser light detected in the power detection step, and after that, the foreign matter removal laser light is irradiated onto and the process gas that is to react with the foreign matter is jetted to a surface of the substrate in a predetermined range from an outer peripheral edge of the substrate so that the foreign matter attached to the surface of the substrate in the predetermined range is decomposed and removed.

According to the first aspect of the present invention, because the amount of misalignment of the substrate and the outside diameter of the substrate are obtained, and the misalignment of the substrate is corrected for based on the power data on the misalignment measurement laser light detected in the power detection step, and after that, the foreign matter removal laser light is irradiated onto and the process gas that is to react with the foreign matter is jetted to the surface of the substrate in a predetermined range from the outer peripheral edge of the substrate so that the foreign matter attached to the surface of the substrate in the predetermined range is decomposed and removed, the need to carry out unnecessary processing can be reduced to the extent possible, and the time required for postprocessing can be shortened.

The first aspect of the present invention can provide a foreign matter removal method, wherein the predetermined range comprises at least a bevel portion of the substrate and a rear surface flat portion of the substrate, and conditions for irradiating the foreign matter removal laser light are varied according to the portions.

According to the first aspect of the present invention, because the predetermined range comprises at least the bevel portion of the substrate and the rear surface flat portion of the substrate, and conditions for irradiating the foreign matter removal laser light are varied according to the portions, postprocessing can be properly carried out at appropriate temperatures without melting the substrate.

The first aspect of the present invention can provide a foreign matter removal method, wherein a direction in which the foreign matter removal laser light is irradiated onto the bevel portion is a direction of a normal to a circular arc cross-section of the bevel portion, and a direction in which the foreign matter removal laser light is irradiated onto the rear surface flat portion is vertical to the rear surface flat portion.

According to the first aspect of the present invention, because the direction in which the foreign matter removal laser light is irradiated onto the bevel portion is the direction of the normal to the circular arc cross-section of the bevel portion, and the direction in which the foreign matter removal laser light is irradiated onto the rear surface flat portion is vertical to the rear surface flat portion, the laser light can be accurately irradiated onto the surfaces to be processed, and thus the surfaces to be processed can be efficiently heated, resulting in an improvement in the foreign matter decomposition efficiency.

The first aspect of the present invention can provide a foreign matter removal method, wherein a speed at which the foreign matter removal laser light scans the bevel portion is set to be lower than a speed at which the foreign matter removal laser light scans the rear surface flat portion, or power of the foreign matter removal laser light on the bevel portion is set to be larger than power of the foreign matter removal laser light on the rear surface flat portion.

According to the first aspect of the present invention, because the speed at which the foreign matter removal laser light scans the bevel portion is set to be lower than the speed at which the foreign matter removal laser light scans the rear surface flat portion, or the power of the foreign matter removal laser light on the bevel portion is set to be larger than the power of the foreign matter removal laser light on the rear surface flat portion, the surfaces to be processed can be heated to such a temperature as to decompose the foreign matter without being excessively heated, so that the foreign matter can be efficiently decomposed and removed.

Accordingly, in a second aspect of the present invention, there is provided a computer-readable storage medium storing a program for causing a computer to execute a foreign matter removal method in which foreign matter attached to a substrate is removed using a foreign matter removal apparatus including a mounting stage adapted to rotate with a substrate mounted thereon, a laser light irradiation unit adapted to irradiate foreign matter removal laser light onto an edge of the substrate rotating on the mounting stage to remove foreign matter attached to the substrate, and a laser light-receiving unit adapted to detect power of the laser light irradiated from the laser light irradiation unit, the foreign matter removal method comprising an irradiation step in which the laser light irradiation unit irradiates misalignment measurement laser light onto the edge of the rotating substrate mounted on the mounting stage, a power detection step in which, of the irradiated misalignment measurement laser light, remaining laser light other than the laser light blocked by the edge of the substrate is received by the laser light-receiving unit, and power of the laser light is detected, a rotation angle detecting step of detecting a rotation angle of the rotating substrate, a calculation step of calculating an amount of misalignment of the substrate based on data on the power of the misalignment measurement laser light detected in the output detecting step and data on the rotation angle detected by the rotation angle detecting step, a correction step of correcting for the misalignment of the substrate based on the calculated amount of misalignment, and a decomposition step in which, after the misalignment has been corrected for, the laser light irradiation unit irradiates foreign matter removal laser light onto the edge of the substrate, and a process gas that is to react with the foreign matter is jetted to the edge of the substrate so that the foreign matter attached to the substrate is decomposed and removed.

The features and advantages of the invention will become more apparent from the following detailed description taken in conjunction with the accompanying drawings.

BRIEF DESCRIPTION OF THE DRAWINGS

FIGS. 4A to 4F are views useful in explaining how a misalignment of a wafer is detected and corrected for;

DETAILED DESCRIPTION OF PREFERRED EMBODIMENTS

The present invention will now be described in detail with reference to the drawings showing a preferred embodiment thereof.

Figure 1:
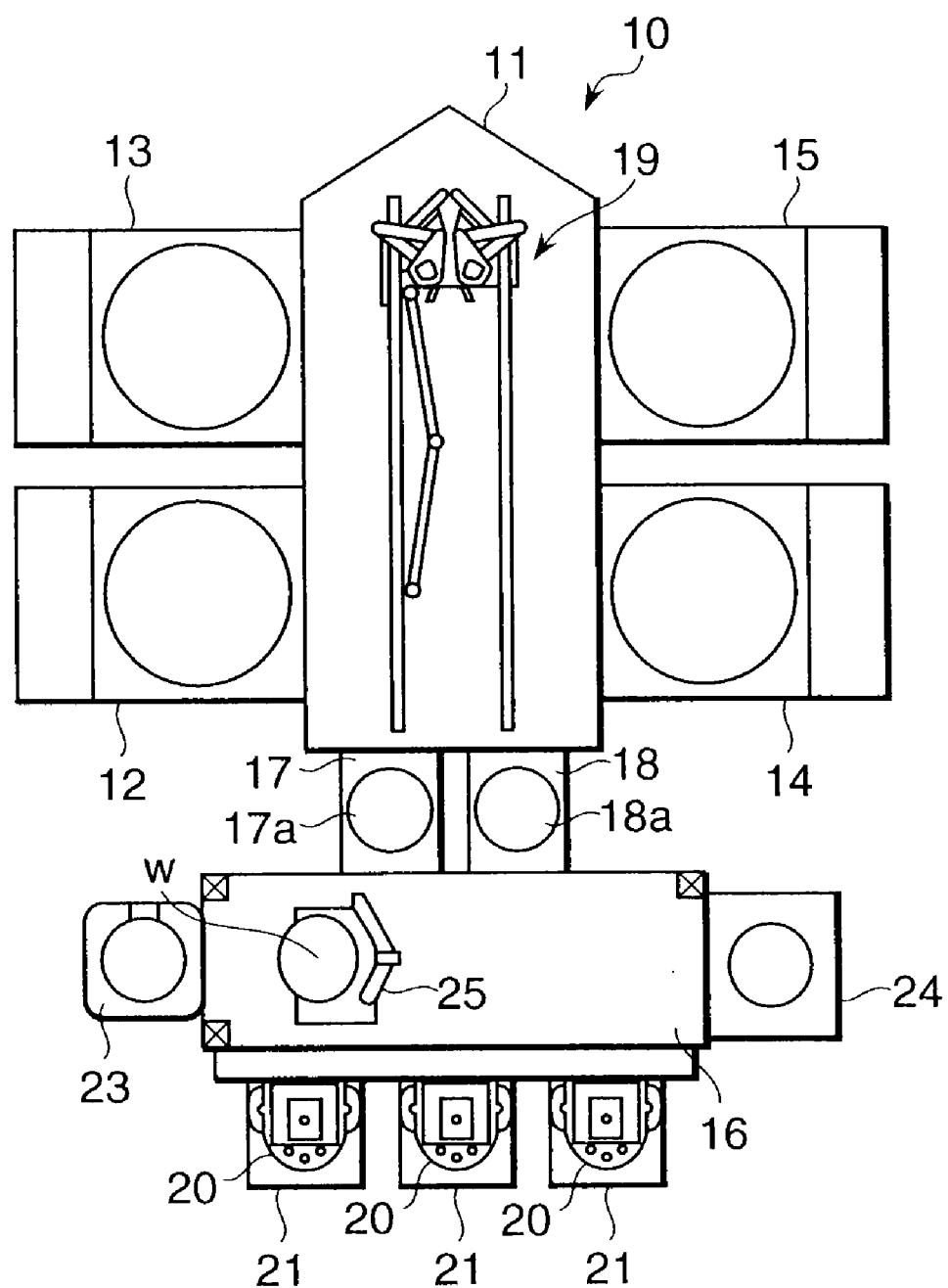
FIG. 1 is a view schematically showing the construction of a substrate processing system having a bevel portion cleaning apparatus applied to a foreign matter removal method according to an embodiment of the present invention.

FIG. 1 is a view schematically showing the construction of a substrate processing system having a bevel portion cleaning apparatus applied to a foreign matter removal method according to an embodiment of the present invention.

Referring to FIG. 1, the substrate processing system 10 has a transfer module 11 that is pentagonal in plan view, two process modules 12 and 13 connected to one side of the transfer module 11, two process modules 14 and 15 connected to the other side of the transfer module 11 such as to face the two process modules 12 and 13, a loader module 16 as a rectangular transfer chamber, and two load-lock modules 17 and 18 that are disposed between the transfer module 11 and the loader module 16 and connect them together.

The transfer module 11 has therein a transfer arm 19 that is able to bend, extend, and turn. The transfer arm 19 transfers wafers W between the process modules 12 to 15 and the load-lock modules 17 and 18.

The process module 12 has a processing chamber (chamber) in which a wafer W is accommodated, and a CF-type deposition gas, for example, a mixed gas of $CHF_3$ gas and a halogenated gas such as HBr gas is introduced as a process gas into the chamber to produce an electrical field in the chamber, so that the process gas is turned into plasma, and the wafer W is etched by the plasma.

Each of the transfer module 11 and the process modules 12 to 15 is constructed such that the interior thereof is held in an evacuated state, and the transfer module 11 and the process modules 12 to 15 are connected together via respective vacuum gate valves (not shown).

The interior of the loader module 16 is held at atmospheric pressure. On the other hand, the interior of the transfer module 11 is held in vacuum. Each of the load-lock modules 17 and 18 has a vacuum gate valve (not shown) at a location joined to the transfer module 11, and has an atmospheric door valve (not shown) at a location joined to the loader module 16, so that each of the load-lock modules 17 and 18 acts as a vacuum preliminary transfer chamber of which inner pressure is adjustable. Moreover, the load-lock modules 17 and 18 have respective wafer mounting stages 17a and 18a on which a wafer W transferred between the loader module 16 and the transfer module 11 is temporarily mounted.

To the loader module 16 are connected three FOUP (front opening unified pod) mounting stages 21 on each of which a FOUP 20 as a container in which, for example, 25 wafers W are accommodated is mounted, and an orienter 23 that pre-aligns a wafer W transferred out from the FOUP 20, and a bevel portion cleaning apparatus 24 as a postprocessing apparatus, as well as the load-lock modules 17 and 18. The orienter 23 is disposed at one end of the loader module 16 in the longitudinal direction thereof, and the bevel portion cleaning apparatus 24 is disposed at the other end.

The loader module 16 has therein a SCARA-type dual-arm transfer arm 25 for transferring wafers W. The transfer arm 25 removes each wafer W from the FOUPs 20 mounted on the FOUP mounting stages 21 and transfers the removed wafer W into and from the load-lock modules 17 and 18, the orienter 23, or the bevel portion cleaning apparatus 24.

Figure 2:
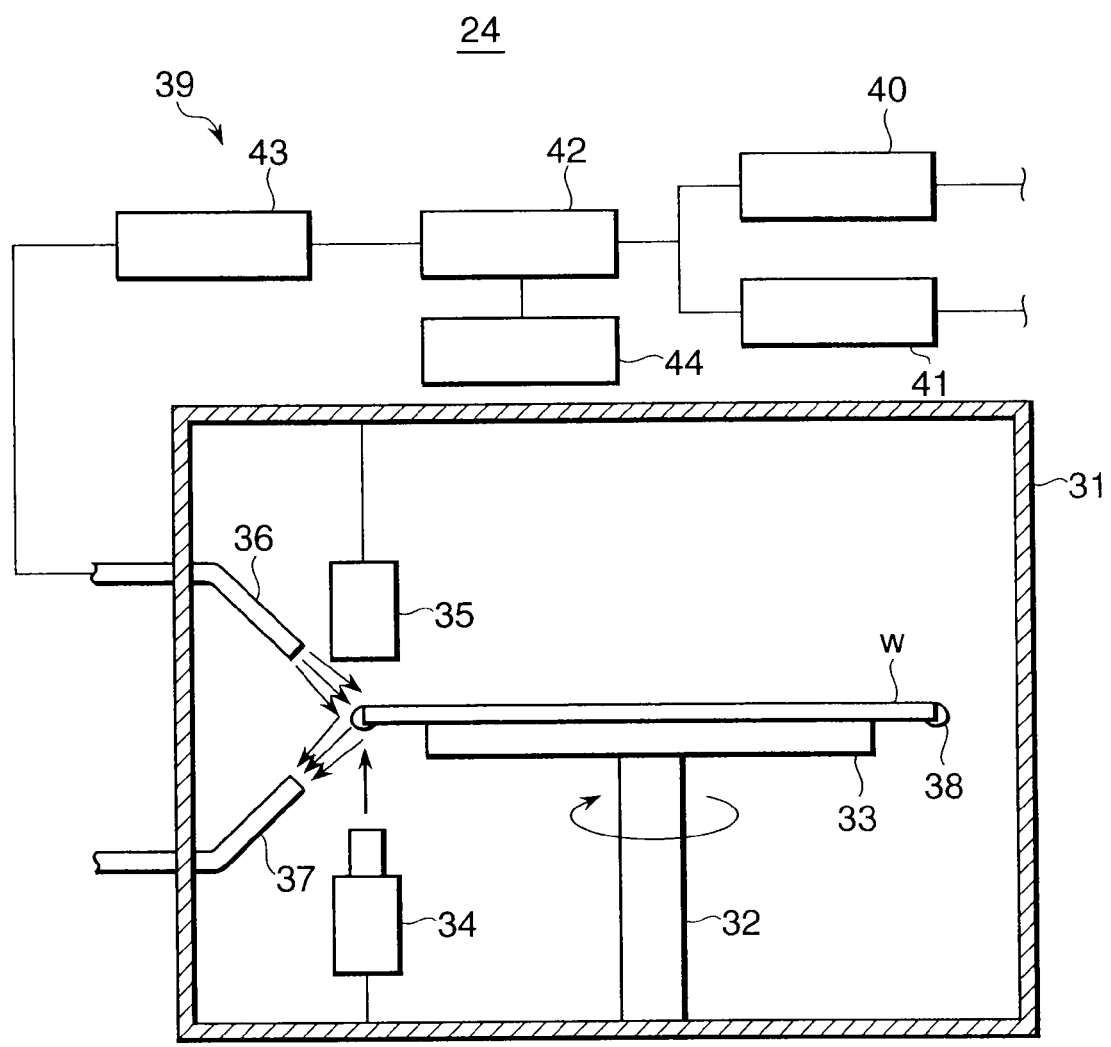
FIG. 2 is a cross-sectional view schematically showing the construction of the bevel portion cleaning apparatus shown in FIG. 1.

FIG. 2 is a cross-sectional view schematically showing the construction of the bevel portion cleaning apparatus 24 shown in FIG. 1.

Referring to FIG. 2, the bevel portion cleaning apparatus 24 has a box-shaped chamber 31 in which a wafer W on which predetermined processing has been performed and is to be subjected to postprocessing is accommodated, and a disk-shaped stage 33 that is disposed in the chamber 31 and supported by a shaft 32 standing from a bottom of the chamber 31. The wafer W is mounted on the stage 33, but the bevel portion of the wafer W projects out from the stage 33 because the diameter of the stage 33 is set to be smaller than that of the wafer W, and hence not only a front surface but also a rear surface of the bevel portion is exposed to a space in the chamber 31.

The stage 33 has a mechanism that attracts the wafer W, for example, an electrostatic chuck or a vacuum chuck, and the shaft 32 rotates about its central axis to rotatably support the wafer W mounted on the stage 33. The chamber 31 has a laser light irradiating unit 34 that is disposed such as to face the rear surface of the bevel portion of the wafer W, a power meter 35 as a laser light-receiving unit that faces the laser light irradiating unit 34 via the bevel portion of the wafer W, a gas supply nozzle 36 that jets and supplies a process gas as an ozone-containing gas toward the bevel portion of the wafer W, and a gas suction nozzle 37 that sucks and removes gas around the bevel portion.

In the bevel portion cleaning apparatus 24, the process gas is supplied toward CF-type deposit 38 attached to the bevel portion of the wafer W, and also, thermal energy is given to the bevel portion by irradiation with laser light. At this time, the CF-type deposit 38 is decomposed into CO, $CO_2$, $F_2$, and so on due to a chemical reaction with ozone gas in the process gas, and the thermal energy given by the laser light promotes this chemical reaction. A major portion of CO, $CO_2$, and $F_2$ as gases produced by the decomposition are sucked and removed by the gas suction nozzle 37. It should be noted that a temperature of the bevel portion of the wafer W is determined based on the power of cleaning laser light irradiated onto the edge of the wafer W and a rotation speed of the wafer W. Here, because the wafer W rotates in a horizontal plane, the entire bevel portion of the wafer W passes the laser irradiating unit 34 and the gas supply nozzle 36, and as a result, the CF-type deposit 38 is removed from the entire bevel portion.

The bevel portion cleaning apparatus 24 has a fan filter unit (not shown) disposed above the chamber 31, and an exhausting unit (not shown) disposed below the chamber 31. The fan filter unit produces a downward flow flowing downward in the chamber 31. The downward flow not only sucks and removes CO, $CO_2$, and $F_2$ having not been sucked by the gas suction nozzle 37, but also prevents particles arising from rotation of the shaft 32 or the stage 33 and the CF-type deposit 38 unexpectedly separated from the bevel portion from rising in the chamber 31 and going above the wafer W.

The bevel portion cleaning apparatus 24 also has a process gas supply system 39. The process gas supply system 39 has an oxygen gas mass flow controller 40 that is connected to an oxygen gas supply unit, not shown, and measures and controls a flow rate of oxygen gas, a nitrogen gas mass flow controller 41 that is connected to a nitrogen gas supply unit, not shown, and measures and controls a flow rate of nitrogen gas, a process gas producing unit 42 that is connected to the oxygen gas mass flow controller 40 and the nitrogen gas mass flow controller 41, a process gas mass flow controller 43 that is interposed between the process gas generating unit 42 and the gas supply nozzle 36 and measures and controls a flow rate of a process gas, and a controller 44 that controls the operation of mainly the process gas generating unit 42.

The process gas generating unit 42 generates an ozone-containing gas as a process gas from a raw gas containing oxygen gas whose flow rate has been adjusted to a predetermined rate by the oxygen gas mass flow controller 40, and nitrogen gas whose flow rate has been adjusted to a very low rate by the nitrogen gas mass flow controller 41.

Figure 3:
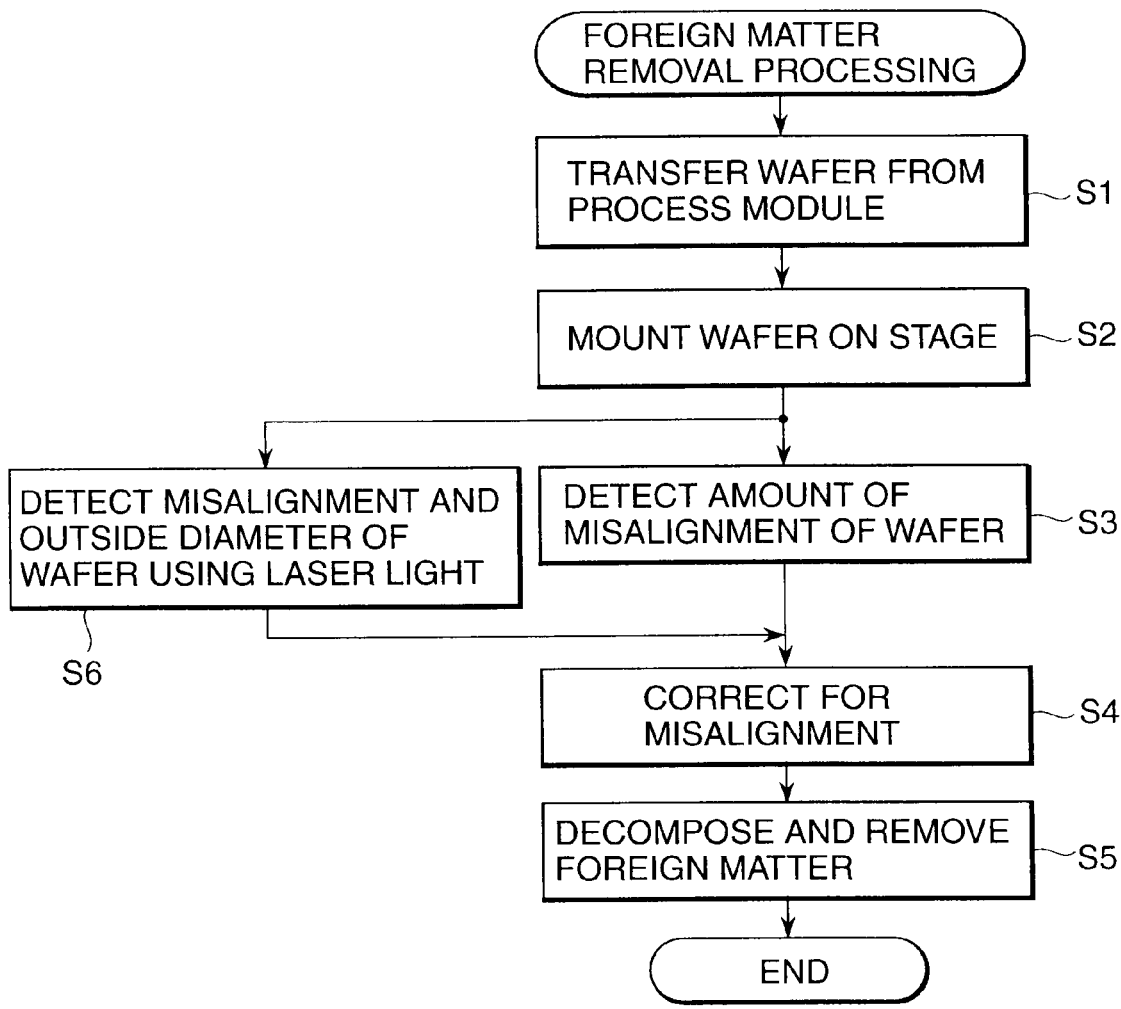
FIG. 3 is a flow chart showing the foreign matter removal method according to the present embodiment.
Figure 5:
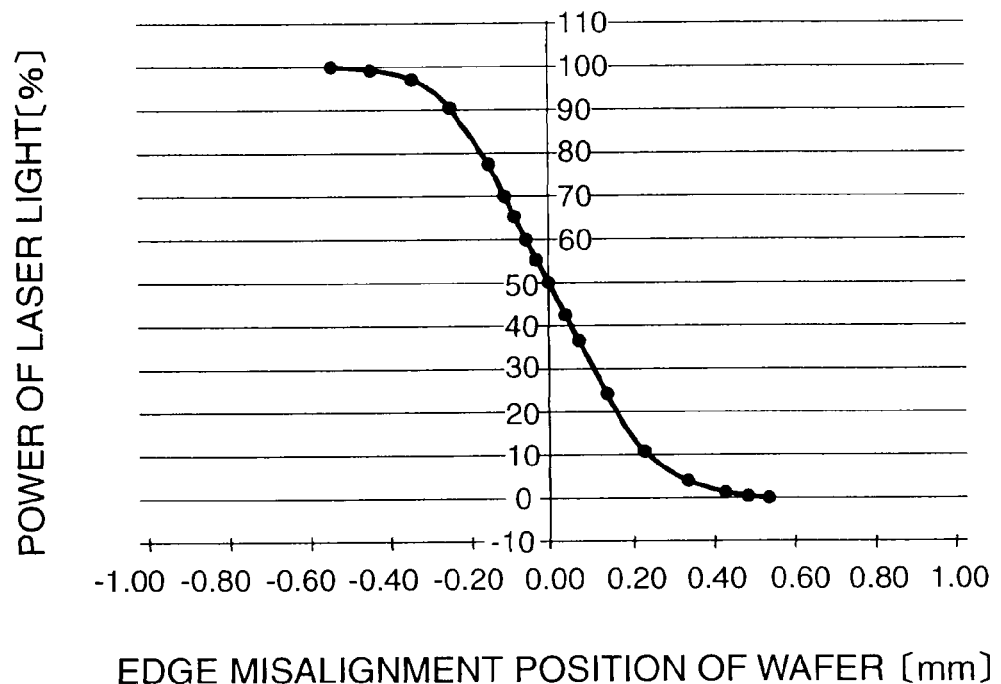
FIG. 5 is a diagram (calibration curve) showing the relationship between power of misalignment measurement laser light received by a light-receiving unit and an amount of edge misalignment of a wafer W.

Referring next to FIGS. 3 to 5, a detailed description will be given of a foreign matter removal method according to the embodiment of the present invention using the bevel portion cleaning apparatus 24 constructed as described above.

FIG. 3 is a flow chart showing the foreign matter removal method according to the present embodiment.

Referring to FIG. 3, at the start of a foreign matter removal processing in which foreign matter attached to a surface of a substrate is removed, first, a wafer W as a substrate to be processed which has been subjected to predetermined plasma processing is transferred out from the chamber of the process module 12 by the transfer arm 19 (step S1), and transferred into the loader module 16 via, for example, the load-lock module 18. Then, the wafer W transferred into the loader module 16 is transferred into the bevel portion cleaning apparatus 24 by the transfer arm 25, and mounted on the stage 33 in the chamber 31 of the bevel portion cleaning apparatus 24 (step S2).

Then, the amount of misalignment of the wafer W mounted on the stage 33 in the bevel portion cleaning apparatus 24 is detected (step S3), and the misalignment is corrected for (step S4). A description will be given later of how the amount of misalignment of the wafer W is detected, and the misalignment is corrected for. After that, cleaning laser light is irradiated onto the wafer W of which the misalignment has been corrected for, so that a bevel polymer as the foreign matter attached to the bevel portion is decomposed and removed, followed by terminating the present process (step S5).

FIGS. 4A to 4F are views useful in explaining how the amount of misalignment of the wafer W is detected, and the misalignment is corrected for.

Referring to FIGS. 4A and 4B, the stage 33 on which the wafer W is mounted has a plurality of pin members 45 that project out by a predetermined amount from a substrate mounting surface of the stage 33, and the wafer W transferred into the chamber 31 is supported by the pin members 45. At this time, the amount of misalignment between a center 32$a$ of the shaft 32 and a center 33$a$ of the stage 33 appears as a width a, and the amount of misalignment between a center 33$a$ of the stage 33 and a center $W_0$ of the wafer W appears as a width b. As a result, the amount of misalignment between the center 32$a$ of the shaft 32 and the center $W_0$ of the wafer W appears as (a+b) (FIG. 4C).

Immediately after the transfer of the wafer W into the chamber 31, the pins 45 move downward with the center $W_0$ of the wafer W and the center 32a of the shaft 32 remaining misaligned by a width (a+b), and the wafer W is mounted on the stage 33 (FIG. 4D).

Then, a motor 46 is driven with the center $W_0$ of the wafer W and the center 32a of the shaft 32 remaining misaligned by the width (a+b), and while the wafer W on the stage 33 is being rotated about the center 32a of the shaft 32, misalignment measurement laser light reduced to, for example, φ0.6 mm is irradiated toward an outer peripheral portion of the rotating wafer W from the laser light irradiation unit 34 (see FIG. 2) disposed on the rear surface side of an edge of the wafer W (lower side as viewed in FIGS. 4A to 4F). Of the irradiated laser light, remaining laser light other than laser light blocked by the edge of the wafer W is received by the power meter 35 disposed such as to face the laser light irradiation unit 34 with the wafer W interposed therebetween, and the power of the laser light is detected.

Here, in a case where the misalignment measurement laser light irradiated from the laser light irradiation unit 34 is not blocked by the wafer W at all, 100% of the irradiated laser light reaches the power meter 35, but in a case where part of the irradiated misalignment measurement laser light is blocked by the edge of the wafer W, and the remaining laser light reaches the power meter 35, when the amount of blocked laser light is changed by the edge of the rotating wafer W, the power meter 35 can measure the power of the laser light according to the amount of misalignment of the wafer W. Thus, by obtaining in advance the relationship between the power of received misalignment measurement laser light and the amount of misalignment of the wafer W, the amount of misalignment of the wafer W can be detected based on the power of the misalignment measurement laser light received by the power meter 35. In this instance, the laser light irradiation unit 34 of the bevel portion cleaning apparatus 24 is disposed at such a location that part, for example, half of the misalignment measurement laser light irradiated from the laser light irradiation unit 34 is blocked by the edge of the wafer W, and the remaining part, for example, half of the misalignment measurement laser light irradiated from the laser light irradiation unit 34 passes the edge of the wafer W to reach the power meter 35. For this reason, the amount of misalignment can be easily detected irrespective of the direction in which the wafer W is misaligned. In this case, if the power of the laser light received by the power meter 35 is constant, this means that the wafer W is not misaligned.

FIG. 5 is a diagram (calibration curve) showing the relationship between the power of the misalignment measurement laser light received by the light-receiving unit (the ratio (%) of the power of laser light received by the power meter 35 to the power of misalignment measurement laser light irradiated from the laser light irradiation unit 34) and the amount of edge position misalignment of a wafer W (equal to the amount of misalignment between the center $W_0$ of the wafer W and the center 32a of the shaft 32).

Referring to FIG. 5, the ordinate indicates the power (%) of the misalignment measurement laser light received by the power meter 35, and the abscissa indicates the amount of misalignment of the wafer W (the edge position of the wafer W) (mm). In a range where the power of laser light is between 10% and 90%, the power of the laser light and the amount of misalignment of the wafer W linearly correspond to each other, and the amount of misalignment of the wafer W is obtained based on the power of the misalignment measurement laser light received by the power meter 35. At this time, a rotation angle θ of the wafer W is detected by a rotation angle detector (not shown) such as a rotary encoder to obtain the relationship between the amount of misalignment of the wafer W and the rotation angle θ of the wafer W.

Then, the misalignment of the wafer W is corrected for based on the obtained amount of misalignment of the wafer W. Namely, data on the power of the laser light received by the power meter 35 and data on the rotation angle θ of the wafer W obtained by the rotation angle detector are inputted to a control unit (not shown) of the bevel portion cleaning apparatus 24. The control unit to which the data has been inputted controls the pin members 45 of the stage 33 based on the input data. The pin members 45 moves upward once with the wafer W mounted thereon, and moves on the X-Y stage by a predetermined width corresponding to the amount of misalignment to compensate for the amount of misalignment, so that the misalignment of the wafer W is corrected for. After that, the pin members 45 are moved downward to center the wafer W at a normal position indicated by FIGS. 4E and 4F. Also, the control unit feeds back the correction data to teaching coordinates of the transfer arm 25 so as to feedback-control the transfer arm 25.

After the misalignment of the wafer W is thus corrected for, the wafer W is rotated, and an ozone-containing gas as a process gas is supplied to the bevel portion, and thermal energy is given to the wafer W by irradiation of cleaning laser light from the laser light irradiation unit 34, so that the CF-type deposit 38 attached to the bevel portion is decomposed through a chemical reaction with the ozone-gas and removed. CO, $CO_2$, $F_2$, and so on as the gases produced by the decomposition are sucked and removed by the gas suction nozzle 37.

According to the present embodiment, because the bevel polymer is removed after the misalignment of the wafer W is detected and corrected for (centering) using the laser light irradiation unit 34 and the power meter 35, which are provided so as to remove the bevel polymer by cleaning, the laser light can be accurately irradiated onto the bevel portion of the wafer W, so that the bevel polymer can be reliably decomposed and removed, and the processing time can be shortened. Namely, as compared with a case where the bevel polymer is removed from the wafer W remaining misaligned, unnecessary processing can be reliably eliminated, and the minimum surface of the wafer W required can be appropriately scanned with laser light. Thus, the processing time can be shortened, and costs can be reduced.

Moreover, according to the present embodiment, because the misalignment of the wafer W can be detected and corrected for using the existing equipment, the functions of the existing equipment can be effectively used without adding misalignment detection equipment.

Moreover, according to the present embodiment, because the calibration curve that is created in advance and expresses the relationship between the power of the misalignment measurement laser light and the amount of edge position misalignment of the wafer W is used, the amount of misalignment of the wafer W can be accurately detected.

Moreover, according to the present embodiment, because the amount of misalignment of the wafer W is measured by directly monitoring the edge of the wafer W, the integration of the amounts of misalignment caused by the repetition of alignment a plurality of times as in the prior art can be prevented, and the need to perform calibration can be eliminated. This leads to downsizing and man-hour decrease of postprocessing equipment.

In the present embodiment, the power of the misalignment measurement laser light and the power of the foreign matter removal laser light are not particularly limited, but they are adjusted to such an extent to achieve desired objects and not to excessively heat the wafer W. This aims at preventing the wafer W from deteriorating, melting, and so on due to excessive heating.

In the present embodiment, the misalignment of the wafer W transferred into the chamber 31 of the bevel portion cleaning apparatus 24 is caused by, for example, an electrostatic chuck (ESC) in the processing chamber and unique to each wafer W, and thus there may be a case where the misalignment of the wafer W cannot be corrected for even by teaching the transfer arm. Thus, it is preferred that the misalignments of the respective wafers W are separately corrected for by feedback control on the coordinates of the transfer arm.

In the present embodiment, the detection of the amount of misalignment of the wafer W and the correction for the misalignment of the wafer W may be carried out at the same time when the bevel polymer is decomposed and removed. Moreover, if there is a notch in the edge of the wafer W, diffused laser light can be obtained according to the size of the notch. Thus, by measuring the diffused light using the laser light-receiving unit, the misalignment of the wafer W may be detected, and at the same time or aside from this, the notch formed in the bevel portion may be detected. Further, after the notches of the respective wafers W are detected, the wafers W may be accommodated in FOUPs or the like while the notches are being aligned.

Next, a description will be given of a variation of the foreign matter removal method according to the present embodiment.

In the present variation, in lieu of the step S3 in the foreign matter removal processing flow in FIG. 3, the amount of misalignment of the wafer W is calculated, and an outside diameter of the wafer W is measured based on data on the power of the misalignment measurement laser light received by the power meter 35 (step S6). In a case where, of the misalignment measurement laser light irradiated from the laser light irradiation unit 34, part of remaining laser light other than the laser light blocked by the edge of the rotating wafer W is received by the power meter 35, when the center $W_0$ of the wafer W is misaligned with respect to the center 32a of the shaft 32, the edge position of the rotating wafer W in FIG. 5 varies along a sine curve. Thus, the outside diameter of the wafer W can be calculated based on the sine curve.

After the amount of misalignment of the wafer W and the outside diameter of the wafer W are calculated, the misalignment of the wafer W is corrected for (step S4), and then the calculated outside diameter of the wafer W is fed back to the position at which the wafer W starts being cleaned, so that the foreign matter removal processing is carried out on the bevel portion and the rear surface flat portion of the wafer W, or the bevel portion, the rear surface flat portion, and an intermediate portion between the bevel portion and the rear surface flat portion of the wafer W under appropriate conditions.

FIGS. 6A to 6D are views useful in explaining the foreign matter removal method in the present variation.

Figure 6A:
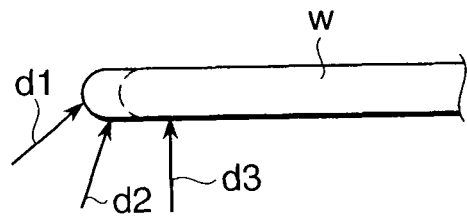
FIGS. 6A to 6D are views useful in explaining a variation of the embodiment of the present invention.
Figure 6B:
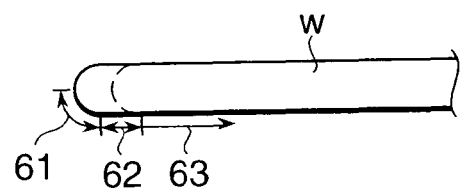
Figure 6C:
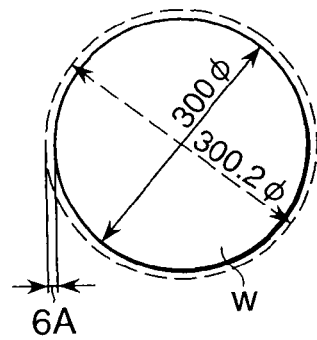

As shown in FIG. 6A, foreign matter removal laser light is irradiated in an oblique direction (direction d1) onto the bevel portion of the wafer W so that the laser light can be irradiated in the direction of the normal to the curved cross section to the extent possible. At this time, a portion of the front surface of the bevel portion to which the irradiate laser light is vertical is narrower as compared with the rear surface flat portion, and hence the scan speed of the laser light on the bevel portion is set to be lower than on the rear surface flat portion so that the temperature required to decompose the bevel polymer as foreign matter can be ensured.

On the other hand, foreign matter removal laser light is irradiated onto the rear surface flat portion of the wafer W in a direction vertical to the cleaned surface (direction d3). At this time, the angle of the laser light irradiated onto the rear surface flat portion can be easily made vertical, and hence if the scan speed of the laser light is set to be equal to the scan speed of the laser light on the bevel portion, the temperature of the rear surface flat portion excessively increases, causing the wafer W to deteriorate or melt. Thus, the scan speed of the foreign matter removal laser light on the rear surface flat portion is set to be faster than the scan speed of the foreign matter removal laser light on the bevel portion so that excessive heating can be prevented. It should be noted that the appropriate temperature required to decompose the foreign matter may be ensured by making the irradiation power of the foreign matter removal laser light on the rear surface flat portion lower than the irradiation power of the foreign matter removal laser light on the bevel portion. Moreover, appropriate conditions intermediate between the conditions for the bevel portion and the conditions for the rear surface flat portion are selected as conditions under which the foreign matter removal laser light is irradiated onto the intermediate portion between the bevel portion and the rear surface flat portion (hereinafter referred to merely as the "intermediate portion").

Figure 6D:
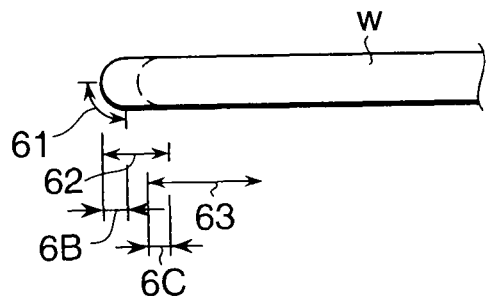
Figure 7A:
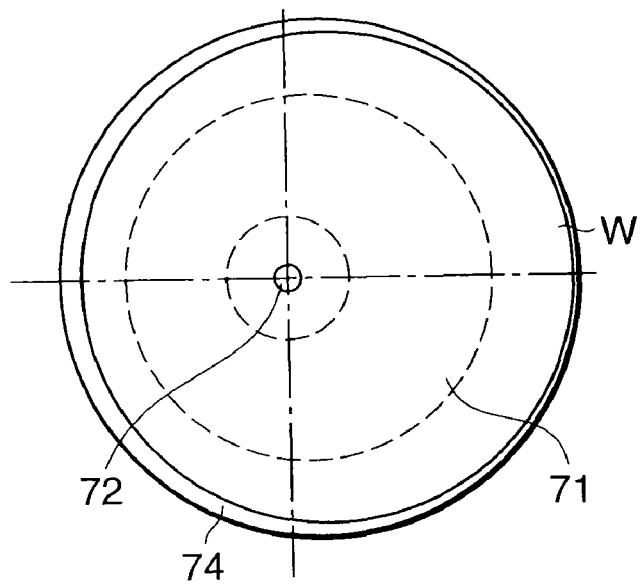
FIGS. 7A and 7B are views useful in explaining the problem of a substrate alignment method using a stage plate.
Figure 7B:
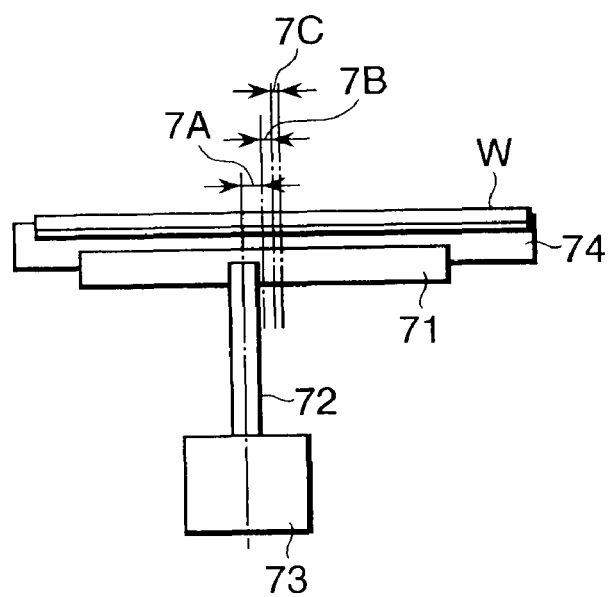

Conventionally, without measuring the exact outside diameter of a wafer W, an outside diameter allowing for an error of, for example, 0.2 mm is taken into consideration with respect to, for example, a ϕ300 mm wafer W (see FIG. 6C), and to prevent poor laser light irradiation at boundaries between laser light irradiated areas (hereinafter also referred to as the "cleaned areas"), processing is carried out with consideration given to overlapping portions at boundaries between the cleaned areas (see FIG. 6D). Thus, there is the problem that the cleaning laser light redundantly scans an area corresponding to a difference 6A (FIG. 6C) between the actual outside diameter of the wafer W and the outside diameter of the wafer W allowing for the error, an area corresponding to an overlap 6B between a bevel portion cleaned area 61 and an intermediate portion cleaned area 62, and an area corresponding to an overlap 6C between the intermediate portion cleaned area 62 and a rear surface flat portion cleaned area 63, and hence the processing time increases with increase in processing area.

On the contrary, in the present variation, by measuring the actual outside diameter of the wafer W, the bevel portion cleaned area 61, the intermediate portion cleaned area 62, and the rear surface flat portion cleaned area 63 are accurately grasped, so that foreign matter can be removed by cleaning under appropriate conditions suitable for the individual cleaned areas.

According to the present embodiment, because after a misalignment of the wafer W as a substrate to be processed is corrected for, and the outside diameter of the wafer W is accurately grasped, the bevel portion cleaned area 61, the intermediate portion cleaned area 62, and the rear surface flat portion cleaned area 63 of the wafer W are accurately grasped in distinction from one another, and the foreign matter removal process is carried out on the individual portions under the optimum processing conditions, unnecessary processing can be eliminated, and the processing time can be shortened.

Although in the present embodiment, the outside diameter of the wafer W is measured at the same time when the amount of misalignment of the wafer W is detected, the outside diameter of the wafer W may be detected by, after detecting the amount of misalignment of the wafer W and correcting for the misalignment of the wafer W, rotating the wafer W and irradiating measurement laser light again onto the edge of the rotating wafer W.

In the present embodiment, foreign matter on the bevel portion of the wafer W is removed by cleaning, the present invention may also be applied similarly to a case where foreign matter (BSP) attached to an area other than the bevel portion, for example, the whole range of the rear surface of the wafer W.

In the above described embodiment, the substrates subjected to the foreign matter removal process are not limited to wafers for semiconductor devices, but rather may instead be any of various substrates used in LCDs (Liquid Crystal Displays) and FPDs (Flat Panel Displays), photomasks, CD substrates, printed boards, or the like.

It is to be understood that the object of the present invention may also be accomplished by supplying a system or apparatus with a storage medium in which a program code of software, which realizes the functions of the above described embodiment is stored, and causing a computer (or CPU or MPU) of the system or apparatus to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied by downloading via a network.

Further, it is to be understood that the functions of the above described embodiment may be accomplished not only by executing a program code read out by a computer, but also by causing an OS (an operating system) or the like which operates on a CPU to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A foreign matter removal method in which foreign matter attached to a substrate is removed using a foreign matter removal apparatus including a mounting stage that rotates with a substrate mounted thereon, a laser light irradiation unit that irradiates foreign matter removal laser light onto an edge of the substrate rotating on the mounting stage to remove foreign matter attached to the substrate, and a laser light-receiving unit that detects power of the laser light irradiated from the laser light irradiation unit, comprising:

an irradiation step in which the laser light irradiation unit irradiates misalignment measurement laser light onto the edge of the rotating substrate mounted on the mounting stage;

a power detection step in which, of the irradiated misalignment measurement laser light, remaining laser light other than the laser light blocked by the edge of the substrate is received by the laser light-receiving unit, and power of the misalignment measurement laser light is detected;

a rotation angle detecting step of detecting a rotation angle of the rotating substrate;

a calculation step of calculating an amount of misalignment of the substrate based on power data of the misalignment measurement laser light detected in said power detection step and data on the rotation angle detected by said rotation angle detecting step;

a correction step of correcting for the misalignment of the substrate by movement of pin members which project out from a substrate mounting surface of the mounting stage and contact with a rear surface of the substrate based on the calculated amount of misalignment; and a decomposition step in which, after the misalignment has been corrected, said laser light irradiation unit irradiates foreign matter removal laser light onto the edge of the substrate, and a process gas that is to react with the foreign matter is jetted to the edge of the substrate so that the foreign matter attached to the substrate is decomposed and removed.

2. A foreign matter removal method as claimed in claim 1, wherein in said calculation step, the amount of misalignment of the substrate is calculated based on a relationship between the amount of misalignment between a center of the substrate and a rotation center of the mounting stage and the power data on the misalignment measurement laser light.

3. A foreign matter removal method as claimed in claim 1, wherein a transfer robot mounts the substrate on the mounting stage, and is feedback-controlled based on the amount of misalignment of the substrate calculated in said calculation step.

4. A foreign matter removal method as claimed in claim 1, wherein in said correction step, the substrate mounted on the mounting stage is lifted up once by said pin members and while being held by said pin members, the substrate is moved in X and Y directions to compensate for the misalignment and then the pin members are buried in the mounting stage so that the substrate is mounted on the mounting stage.

5. A foreign matter removal method as claimed in claim 1, wherein the amount of misalignment of the substrate and an outside diameter of the substrate are obtained based on the power data on the misalignment measurement laser light detected in said power detection step, and the misalignment of the substrate is corrected, and wherein the foreign matter removal laser light is irradiated onto the substrate and the process gas that is to react with the foreign matter is jetted to a surface of the substrate in a predetermined range from an outer peripheral edge of the substrate so that the foreign matter attached to the surface of the substrate in the predetermined range is decomposed and removed.

6. A foreign matter removal method as claimed in claim 5, wherein the predetermined range comprises at least a bevel portion of the substrate and a rear surface flat portion of the substrate, and conditions for irradiating the foreign matter removal laser light are varied according to the portions.

7. A foreign matter removal method as claimed in claim 6, wherein a direction in which the foreign matter removal laser light is irradiated onto the bevel portion is a direction of a normal to a circular arc cross-section of the bevel portion, and a direction in which the foreign matter removal laser light is irradiated onto the rear surface flat portion is vertical to the rear surface flat portion.

8. A foreign matter removal method as claimed in claim 7, wherein a speed at which the foreign matter removal laser light scans the bevel portion is set to be lower than a speed at which the foreign matter removal laser light scans the rear surface flat portion, or power of the foreign matter removal laser light on the bevel portion is set to be larger than power of the foreign matter removal laser light on the rear surface flat portion.

9. A computer-readable storage medium storing a program for causing a computer to execute a foreign matter removal method in which foreign matter attached to a substrate is removed using a foreign matter removal apparatus including a mounting stage adapted to rotate with a substrate mounted thereon, a laser light irradiation unit adapted to irradiate foreign matter removal laser light onto an edge of the substrate rotating on the mounting stage to remove foreign matter attached to the substrate, and a laser light-receiving unit adapted to detect power of the laser light irradiated from the laser light irradiation unit, the foreign matter removal method comprising:

an irradiation step in which the laser light irradiation unit irradiates misalignment measurement laser light onto the edge of the rotating substrate mounted on the mounting stage;

a power detection step in which, of the irradiated misalignment measurement laser light, remaining laser light other than the laser light blocked by the edge of the substrate is received by the laser light-receiving unit, and power of the misalignment measurement laser light is detected;

a rotation angle detecting step of detecting a rotation angle of the rotating substrate;

a calculation step of calculating an amount of misalignment of the substrate based on power data of the misalignment measurement laser light detected in said power detection step and data on the rotation angle detected by said rotation angle detecting step;

a correction step of correcting for the misalignment of the substrate by movement of pin members which project out from a substrate mounting surface of the mounting stage and contact with a rear surface of the substrate based on the calculated amount of misalignment; and a decomposition step in which, after the misalignment has been corrected, said laser light irradiation unit irradiates foreign matter removal laser light onto the edge of the substrate, and a process gas that is to react with the foreign matter is jetted to the edge of the substrate so that the foreign matter attached to the substrate is decomposed and removed.

* * * * *